United States Patent
Jefremow et al.

(10) Patent No.: US 11,621,717 B1
(45) Date of Patent: Apr. 4, 2023

(54) NON-LINEAR INTER-ADC CALIBRATION BY TIME EQUIDISTANT TRIGGERING

(71) Applicant: Infineon Technologies AG, Neubiberg (DE)

(72) Inventors: Mihail Jefremow, Augsburg (DE); Ralph Mueller-Eschenbach, Munich (DE); Juergen Schaefer, Oberhaching (DE); Arndt Voigtlaender, Ottobrunn (DE); David Zipperstein, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/519,759

(22) Filed: Nov. 5, 2021

(51) Int. Cl.
| | | |
|---|---|---|
| H03M 1/10 | (2006.01) | |
| H03M 1/50 | (2006.01) | |
| H03M 1/46 | (2006.01) | |
| H03M 1/12 | (2006.01) | |

(52) U.S. Cl.
CPC ....... *H03M 1/1071* (2013.01); *H03M 1/1014* (2013.01); *H03M 1/1245* (2013.01); *H03M 1/462* (2013.01); *H03M 1/504* (2013.01)

(58) Field of Classification Search
CPC .......................... H03M 1/1071; H03M 1/1014
USPC .......................... 341/155, 118, 159
See application file for complete search history.

(56) References Cited

U.S. PATENT DOCUMENTS

| | | | | |
|---|---|---|---|---|
| 9,485,039 B1 * | 11/2016 | Malkin | .................. | H04B 17/21 |
| 10,218,372 B1 * | 2/2019 | Farley | ................. | H03M 1/0836 |
| 2019/0277887 A1 * | 9/2019 | Landolt | .................. | H03K 5/135 |

* cited by examiner

*Primary Examiner* — Peguy Jean Pierre
(74) *Attorney, Agent, or Firm* — Banner & Witcoff Ltd.

(57) ABSTRACT

A calibration circuit, including: a first analog-to-digital converter (ADC) configured to sample a nonlinear reference signal continuously at an equidistant sampling rate to generate a reference sampled signal; a trigger timer configured to generate trigger signals; a second ADC configured to sample a point of each of the nonlinear reference signal and repeated versions of the nonlinear reference signal in response to the respective trigger signals at equidistantly increasing delays, to generate a device-under-test (DUT) sampled voltage; and processing circuitry configured to estimate a differential nonlinearity (DNL) of the DUT sampled signal, estimate a DNL of the reference sampled signal, and compare the estimated DNL of the DUT sampled signal with the estimated DNL of the reference sampled signal, to generate a DNL performance indication signal of the second ADC.

19 Claims, 4 Drawing Sheets

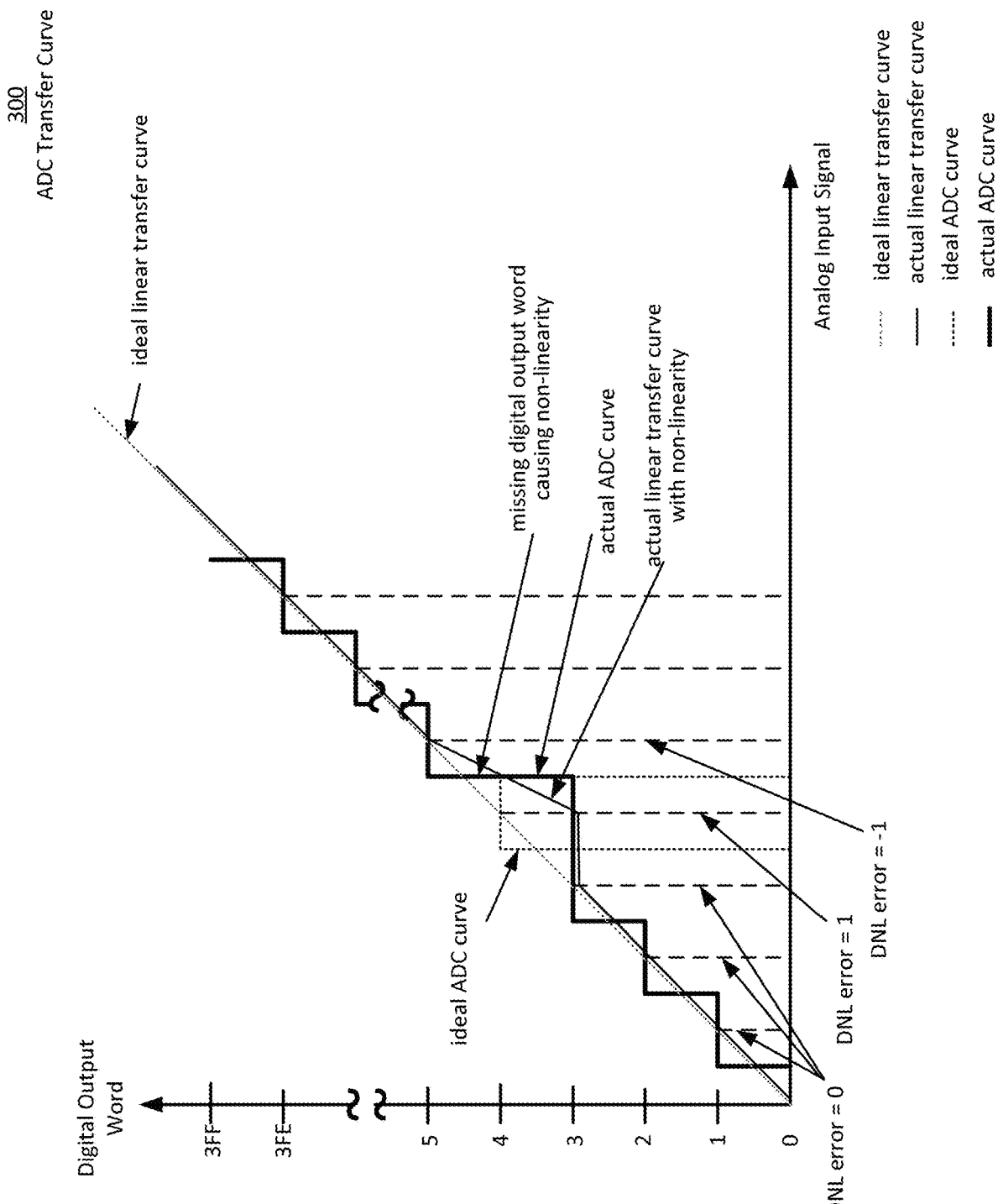

NON-LINEAR INTER-ADC CALIBRATION BY TIME EQUIDISTANT TRIGGERING

BACKGROUND

Analog-to-digital converter (ADC) sensitivity may be defined by differential non-linearity (DNL) and integrated non-linearity (INL). DNL is a deviation between an actual analog input signal and an ideal analog input signal for a given digital output word. INL is an integrated DNL. Measurements of DNL and INL require a special printed circuit board (PCB) design and equipment.

FIG. 3 illustrates an ADC transfer curve 300. The x-axis represents the analog input signal, and the y-axis represents the digital output word. The ideal transfer curve is a monotonic step function having a same number of steps in each voltage region, which in this example, after each least significant bit change in the analog input signal, the digital output word changes by one. This ideal linear transfer curve is generally represented as a linear line. The actual transfer curve, however, may have a step shifted to the left or right due to a missing digital output word. This means there needs to be perhaps twice the least significant bit for there to be a digital output word change, or the digital output word may change not by one word, but by two. A DNL error of 0 means the steps are accurate, a DNL error of 1 means one more step is needed, and a DNL error of −1 is when there is twice the ideal digital output word. This DNL error results in the actual transfer curve having non-linearity as shown.

There is increasing interest in better DNL and INL performance for ADCs used for applications such as vehicle state modeling with Kalman filters. System designers want to know the ADC performance (DNL, INL, noise . . . ) in a final application, including the PCB, external components, software stack, etc.

BRIEF DESCRIPTION OF THE DRAWINGS

FIG. 3 illustrates an analog-to-digital converter transfer curve.

DETAILED DESCRIPTION

The present disclosure is directed to nonlinear inter-ADC calibration by time equi-distant triggering for a system with respect to ADC performance in a final application based on DNL/INL.

Figure 1A:
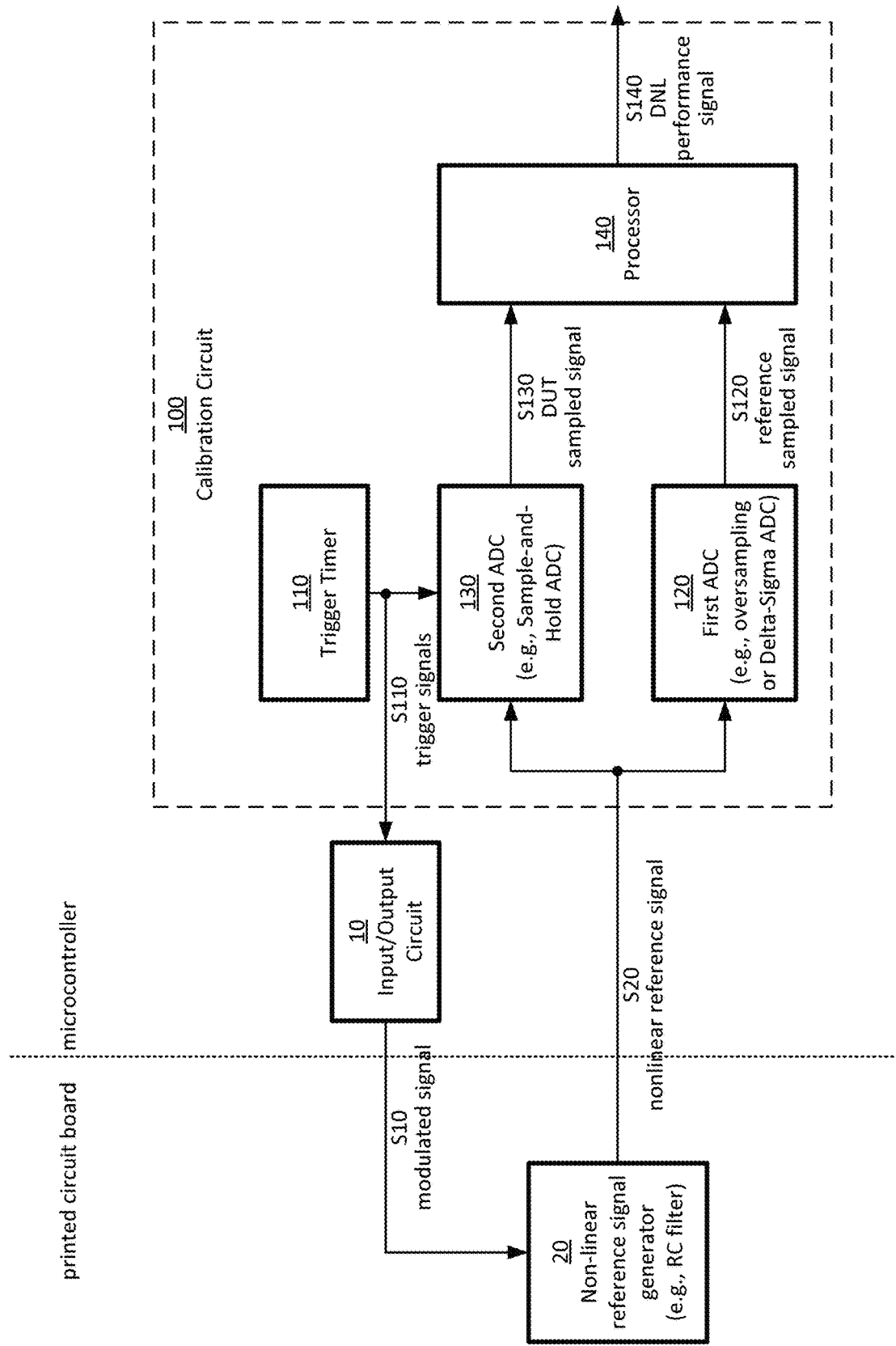
FIG. 1A illustrates a schematic diagram of a calibration circuit in accordance with aspects of the disclosure.
Figure 1B:
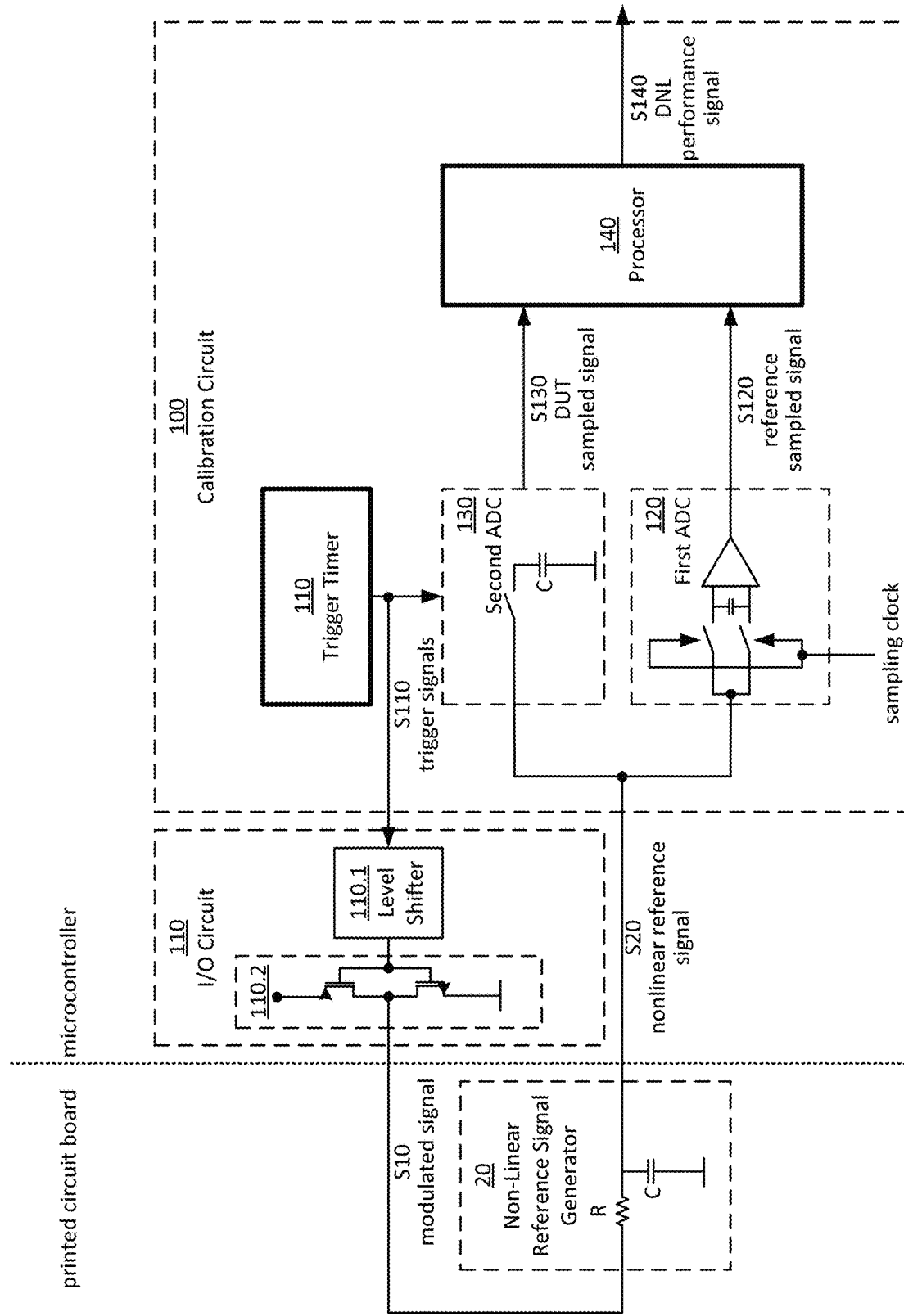
FIG. 1B illustrates a schematic diagram of specific examples of components of the calibration circuit of FIG. 1A.
Figure 2:
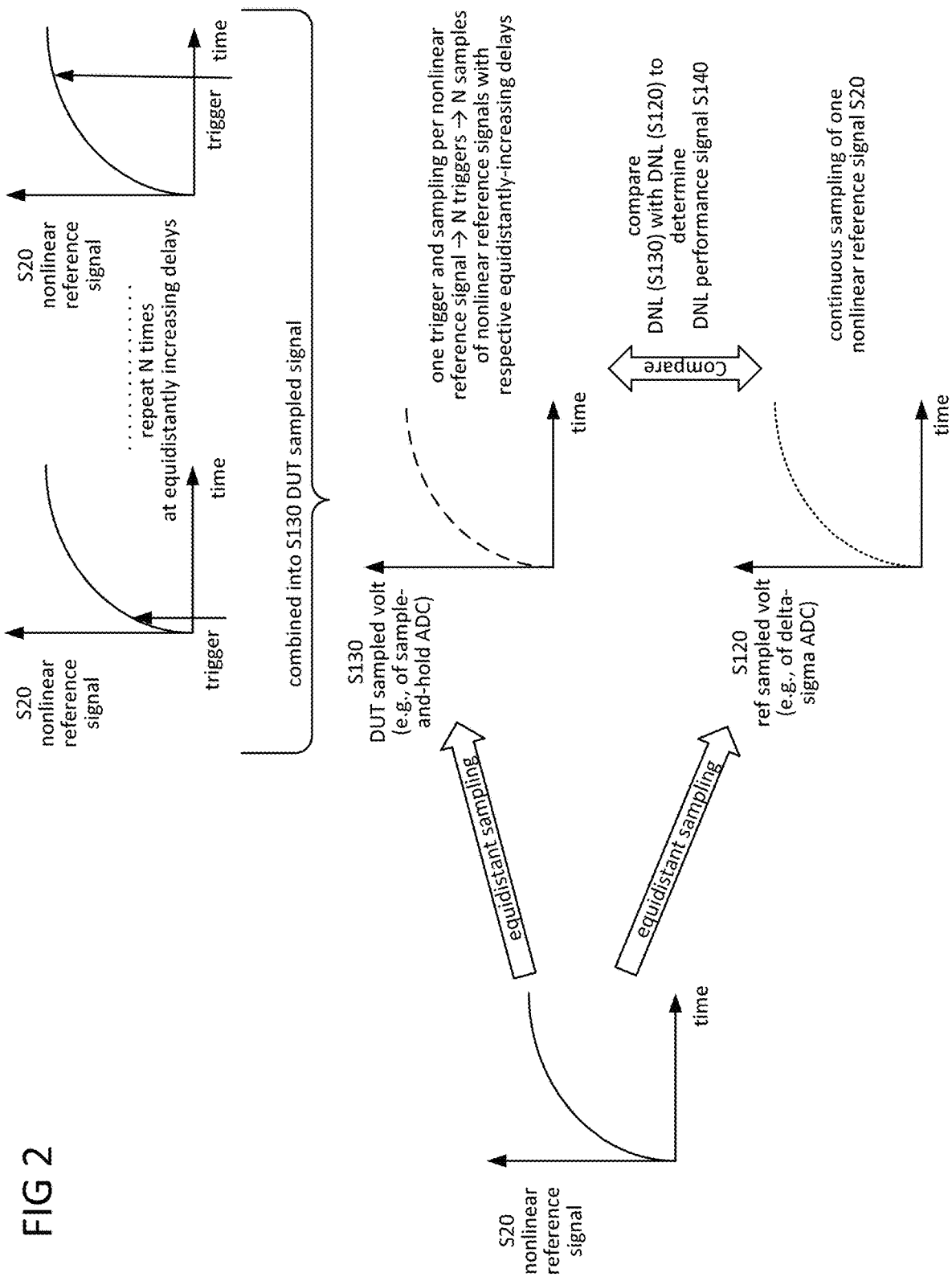
FIG. 2 illustrates timing diagrams of the calibration circuit of FIG. 1A.

FIG. 1A illustrates a schematic diagram of a calibration circuit 100 in accordance with aspects of the disclosure. FIG. 1B illustrates a schematic diagram of specific examples of components of the calibration circuit 100 and is not meant to be limiting. And FIG. 2 illustrates timing diagrams of the calibration circuit of FIG. 1A.

The calibration circuit 100 comprises a trigger timer 110, a first analog-to-digital converter (ADC) 120, a second ADC 130, and a processor 140. The calibration circuit 100 is coupled to an input/output (I/O) circuit 10. The trigger timer 110, the first ADC 120, the second ADC 130, and the I/O circuit 10 are provided on a same chip, which may be that of a microcontroller. The calibration circuit 100 is coupled via the I/O circuit 10 to a non-linear reference signal generator 20 that is not provided on the same chip as the calibration circuit 100 and the I/O circuit 10, although the disclosure is not necessarily limited in this respect.

The trigger timer 110 is a general timer configured to generate trigger signals 5110, which may be pulse width modulated (PWM) signals. The triggering may be based on an external crystal, an internal clock generator, or the like.

The I/O circuit 10 is configured to generate a modulated signal S10 in response to the trigger signals 5110. The example I/O circuit 10 of FIG. 1B comprises a level shifter 110.1 and a pull-up pull-down circuit 110.2.

The reference signal generator 20 generates the nonlinear reference signal S20 based on the modulated signal S10 from the I/O circuit 10. The reference signal generator 20 may comprise, for example, a resistor-capacitor (RC) filter on a printed circuit board. The output nonlinear reference signal S20 is an RC curve, but the disclosure is not limited in this respect. The nonlinear reference signal S20 may be any nonlinear signal that is reproducable, such as a ramp, sine wave, oscillating signal, or the like.

The first and second ADCs 120, 130 are different types of ADCs. The first ADC 120 may be an oversampling ADC, or alternatively, a delta-sigma ($\Delta\Sigma$) ADC. The second ADC 130 may be a sample-and-hold ADC, or alternatively, a successive approximation register (SAR) ADC, a flash ADC, a pipeline ADC, or a dual-slope ADC. The first ADC 120 is assumed to have better performance and is used as a reference. The second ADC 130 has an unknown performance, which is the information of interest. The first ADC 120 converts a known reference to a reference signal, and the second ADC 130 converts the known reference to a device-under-test (DUT) signal to be analyzed. The processor 140 then compares the DUT sampled signal 5130 with the reference sampled signal 5120 as explained below.

More specifically, the first ADC 120 is configured to sample a nonlinear reference signal S20 continuously at an equidistant sampling rate to generate a reference sampled signal 5120. The first ADC 120 continuously samples and converts one resistor-capacitor (RC) curve.

The second ADC 130 requires more time to sample that the first ADC 120. In order for the second ADC 130 to obtain at least a similar number of samples as the first ADC 120, the non-linear reference signal generator 20 charges a pad on a printed circuit board repeatedly to generate the nonlinear reference signal S20. The second ADC 130 is configured to sample a point of each of the nonlinear reference signal S20 and repeated versions of the nonlinear reference signal S20 in response to the respective trigger signals 5110 at equidistantly increasing delays ("equidistant hardware trigger") to generate a DUT sampled voltage 5130. In this regard, a rising edge of the trigger signal 5110 is delayed with respect to the rising edge of the I/O circuit 10. The processor 140 then combines these voltages sampled by the second ADC 130 into one curve.

The processor 140 is configured to estimate a DNL of the DUT sampled signal 5130, estimate a DNL of the reference sampled signal 5120, and compare these DNLs to generate a DNL performance indication signal 5140 of the second ADC 130. The processor 140 estimates the DNL by calculating the delta between each sample and its previous sample. The DNL, which is the delta between sampling points, is greater in the beginning of the curve because the non-linear reference signal S20 is changing faster. More specifically, the processor 140 first calculates the delta of the first ADC 120 for each sample, $\text{delta}_{1ADC}$, and calculates the delta of second ADC 130 for each sample, $\text{delta}_{2DC}$. The processor 140 then calculates the difference between both deltas:

$$\text{delta}_{DNL} = \text{delta}_{1ADC} - \text{delta}_{2ADC} \qquad \text{(Equation 1)}$$

where $\text{delta}_{DNL}$ is a representation/measurement for DNL performance of the second ADC 130, with the DNL performance of the first ADC 120 used as a reference for the second ADC 130. The delta is irrespective of gain and offset, by normalizing both ADC output curves before doing delta calculations. The greater the difference between the two DNLs, the worse the performance of the second ADC 130.

The aspects disclosed herein do not require an expensive external signal generator for ADC performance characterization. Measurements may be made during microcontroller runtime and under application conditions on a customer board; external measurements in a final application are not possible for the accuracies required. The aspects can be used as a tool for printed circuit board design assessment for ADC, and for DNL/INL assessment of a customer system.

The term "processor" as, for example, used herein may be understood as any kind of technological entity that allows handling of data. The data may be handled according to one or more specific functions executed by the processor or controller. Further, a processor as used herein may be understood as any kind of circuit, e.g., any kind of analog or digital circuit. A processor may thus be or include an analog circuit, digital circuit, mixed-signal circuit, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Any other kind of implementation of the respective functions, which will be described below in further detail, may also be understood as a processor, controller, or logic circuit. It is understood that any two (or more) of the processors, controllers, or logic circuits detailed herein may be realized as a single entity with equivalent functionality or the like, and conversely that any single processor, controller, or logic circuit detailed herein may be realized as two (or more) separate entities with equivalent functionality or the like.

The techniques of this disclosure may also be described in the following examples.

Example 1 is a calibration circuit, comprising: a first analog-to-digital converter (ADC) configured to sample a nonlinear reference signal continuously at an equidistant sampling rate to generate a reference sampled signal; a trigger timer configured to generate trigger signals; a second ADC configured to sample a point of each of the nonlinear reference signal and repeated versions of the nonlinear reference signal in response to the respective trigger signals at equidistantly increasing delays, to generate a device-under-test (DUT) sampled voltage; and processing circuitry configured to estimate a differential nonlinearity (DNL) of the DUT sampled signal, estimate a DNL of the reference sampled signal, and compare the estimated DNL of the DUT sampled signal with the estimated DNL of the reference sampled signal, to generate a DNL performance indication signal of the second ADC.

Example 2. The calibration circuit of example 1, wherein the first and second ADCs are different types of ADCs.

Example 3. The calibration circuit of example 1, wherein the first ADC is an oversampling ADC.

Example 4. The calibration circuit of example 1, wherein the first ADC is a delta-sigma ADC.

Example 5. The calibration circuit of example 1, wherein the second ADC is a sample-and-hold ADC.

Example 6. The calibration circuit of example 1, wherein the second ADC is a successive approximation register (SAR) ADC.

Example 7. The calibration circuit of example 1, wherein the second ADC is a flash ADC, a pipeline ADC, or a dual-slope ADC.

Example 8. The calibration circuit of example 1, further comprising: an input/output (I/O) circuit configured to generate a modulated signal in response to the trigger signals, wherein the nonlinear reference signal is generated by a reference signal generator based on the modulated signal.

Example 9. The calibration circuit of example 8, wherein the reference signal generator is a nonlinear filter.

Example 10. The calibration circuit of example 1, wherein the processing circuitry is further configured to normalize the reference sampled signal.

Example 11. The calibration circuit of example 1, wherein the processing circuitry is further configured to interpolate sampled values of the reference sampled signal to have a substantially equal number of sampled values as the DUT sampled signal.

Example 12. The calibration circuit of example 1, wherein the hardware trigger timer is configured to generate the trigger signals based on an external crystal or an internal clock generator.

Example 13. The calibration circuit of example 1, wherein the DNL performance signal is for calibrating the second ADC.

Example 14. A microcontroller comprising the calibration circuit of example 1.

Example 15. A calibration method, comprising: sampling, by a first analog-to-digital converter (ADC), a nonlinear reference signal continuously at an equidistant sampling rate to generate a reference sampled signal; generating, by a trigger timer, trigger signals; sampling, by a second ADC, a point of each of the nonlinear reference signal and repeated versions of the nonlinear reference signal in response to the respective trigger signals at equidistantly increasing delays, to generate a device-under-test (DUT) sampled voltage; estimating, by processing circuitry, a differential nonlinearity (DNL) of the DUT sampled signal and a DNL of the reference sampled signal; and comparing, by the processing circuitry, the estimated DNL of the DUT sampled signal with the estimated DNL of the reference sampled signal, to generate a DNL performance indication signal of the second ADC.

Example 16. The calibration method of example 15, further comprising: generating, by an input/output (I/O) circuit, a modulated signal in response to the trigger signals, wherein the nonlinear reference signal is generated by a reference signal generator based on the modulated signal.

Example 17. The calibration method of example 15, further comprising: normalizing the reference sampled signal.

Example 18. The calibration method of example 15, further comprising: interpolating sampled values of the reference sampled signal to have a substantially equal number of sampled values as the DUT sampled signal.

Example 19. The calibration method of example 15, wherein the first ADC is an oversampling ADC, and the second ADC is a sample-and-hold ADC.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

What is claimed is:

1. A calibration circuit, comprising:
   a first analog-to-digital converter (ADC) configured to sample a nonlinear reference signal continuously at an equidistant sampling rate to generate a reference sampled signal;
   a trigger timer configured to generate trigger signals;
   a second ADC configured to sample a point of each of the nonlinear reference signal and repeated versions of the nonlinear reference signal in response to the respective trigger signals at equidistantly increasing delays, to generate a device-under-test (DUT) sampled voltage; and
   processing circuitry configured to estimate a differential nonlinearity (DNL) of the DUT sampled signal, estimate a DNL of the reference sampled signal, and compare the estimated DNL of the DUT sampled signal with the estimated DNL of the reference sampled signal, to generate a DNL performance indication signal of the second ADC.

2. The calibration circuit of claim 1, wherein the first and second ADCs are different types of ADCs.

3. The calibration circuit of claim 1, wherein the first ADC is an oversampling ADC.

4. The calibration circuit of claim 1, wherein the first ADC is a delta-sigma ADC.

5. The calibration circuit of claim 1, wherein the second ADC is a sample-and-hold ADC.

6. The calibration circuit of claim 1, wherein the second ADC is a successive approximation register (SAR) ADC.

7. The calibration circuit of claim 1, wherein the second ADC is a flash ADC, a pipeline ADC, or a dual-slope ADC.

8. The calibration circuit of claim 1, further comprising:
   an input/output (I/O) circuit configured to generate a modulated signal in response to the trigger signals,
   wherein the nonlinear reference signal is generated by a reference signal generator based on the modulated signal.

9. The calibration circuit of claim 8, wherein the reference signal generator is a nonlinear filter.

10. The calibration circuit of claim 1, wherein the processing circuitry is further configured to normalize the reference sampled signal.

11. The calibration circuit of claim 1, wherein the processing circuitry is further configured to interpolate sampled values of the reference sampled signal to have a substantially equal number of sampled values as the DUT sampled signal.

12. The calibration circuit of claim 1, wherein the hardware trigger timer is configured to generate the trigger signals based on an external crystal or an internal clock generator.

13. The calibration circuit of claim 1, wherein the DNL performance signal is for calibrating the second ADC.

14. A microcontroller comprising the calibration circuit of claim 1.

15. A calibration method, comprising:
   sampling, by a first analog-to-digital converter (ADC), a nonlinear reference signal continuously at an equidistant sampling rate to generate a reference sampled signal;
   generating, by a trigger timer, trigger signals;
   sampling, by a second ADC, a point of each of the nonlinear reference signal and repeated versions of the nonlinear reference signal in response to the respective trigger signals at equidistantly increasing delays, to generate a device-under-test (DUT) sampled voltage;
   estimating, by processing circuitry, a differential nonlinearity (DNL) of the DUT sampled signal and a DNL of the reference sampled signal; and
   comparing, by the processing circuitry, the estimated DNL of the DUT sampled signal with the estimated DNL of the reference sampled signal, to generate a DNL performance indication signal of the second ADC.

16. The calibration method of claim 15, further comprising:
   generating, by an input/output (I/O) circuit, a modulated signal in response to the trigger signals,
   wherein the nonlinear reference signal is generated by a reference signal generator based on the modulated signal.

17. The calibration method of claim 15, further comprising:
   normalizing the reference sampled signal.

18. The calibration method of claim 15, further comprising:
   interpolating sampled values of the reference sampled signal to have a substantially equal number of sampled values as the DUT sampled signal.

19. The calibration method of claim 15, wherein the first ADC is an oversampling ADC, and the second ADC is a sample-and-hold ADC.

* * * * *